United States Patent
Gorman et al.

(10) Patent No.: US 7,702,976 B2
(45) Date of Patent: *Apr. 20, 2010

(54) INTEGRATION OF LBIST INTO ARRAY BISR FLOW

(75) Inventors: Kevin W. Gorman, Cambridge, VT (US); Michael R. Oullette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 138 days.

This patent is subject to a terminal disclaimer.

(21) Appl. No.: 12/101,457

(22) Filed: Apr. 11, 2008

(65) Prior Publication Data

US 2009/0251978 A1 Oct. 8, 2009

Related U.S. Application Data

(63) Continuation of application No. 12/099,382, filed on Apr. 8, 2008.

(51) Int. Cl.
*G01R 31/28* (2006.01)
*G11C 29/00* (2006.01)
(52) U.S. Cl. ..................... 714/724; 714/718
(58) Field of Classification Search ......... 714/710–711, 714/718–719, 723–724, 726, 729, 732–736; 365/200–201

See application file for complete search history.

(56) References Cited

U.S. PATENT DOCUMENTS

| | | | |
|---|---|---|---|
| 4,798,976 A | 1/1989 | Curtin et al. | |
| 5,313,424 A * | 5/1994 | Adams et al. | 365/200 |
| 6,166,559 A | 12/2000 | McClintock et al. | |
| 6,504,772 B2 * | 1/2003 | Maeno | 365/201 |
| 6,785,841 B2 | 8/2004 | Akrout et al. | |
| 6,861,865 B1 | 3/2005 | Carlson | |

(Continued)

OTHER PUBLICATIONS

"A modular wrapper enabling high speed BIST and repair for small wide memories" by Aitken, R.C. This paper appears in: Test Conference, 2004. Proceedings. ITC 2004. International Publication Date: Oct. 26-28, 2004 On pp. 997-1005 ISBN: 0-7803-8580-2 INSPEC Accession No. 8291791.*

(Continued)

*Primary Examiner*—Cynthia Britt
(74) *Attorney, Agent, or Firm*—Gibb I.P. Law Firm, LLC; W. Riyon Harding, Esq.

(57) ABSTRACT

A method, an integrated circuit structure, and an associated design structure for the integrated circuit structure have a plurality of logic blocks, at least one of which is a redundant logic block. In addition, the structure includes a logic built-in self test device (LBIST) operatively connected to the logic blocks that determines the functionality of each of the logic blocks. An array of memory elements is included within the structure and is operatively connected to the logic blocks. At least one of the memory elements comprises a redundant memory element. The structure also includes an array built-in self test device (ABIST) operatively connected to the array of memory elements that determines the functionality of each of the memory elements. One feature is the use of a single controller operatively connected to the register, the logic blocks, and the memory elements. The single controller repairs both the logic blocks elements that have failing functionality and the memory elements that have failing functionality.

19 Claims, 3 Drawing Sheets

U.S. PATENT DOCUMENTS

| | | |
|---|---|---|
| 6,965,249 B2 | 11/2005 | Lane et al. |
| 7,047,466 B2 | 5/2006 | Meaney et al. |
| 7,082,513 B2 * | 7/2006 | Fuhrmann et al. ........... 711/217 |
| 7,254,762 B2 * | 8/2007 | Anzou et al. ................ 714/733 |
| 2009/0161429 A1 * | 6/2009 | Chen et al. ............. 365/185.09 |

OTHER PUBLICATIONS

B. J. Flehinger, "Reliability Improvement Through Redundancy at Various System Levels", IBM Journal Apr. 1958, pp. 148-158.

Gorman et al., U.S. Appl. No. 12/099,382, BUR920080012US1, Office Action Communication, Oct. 29, 2009, 11 pages.

* cited by examiner

INTEGRATION OF LBIST INTO ARRAY BISR FLOW

CROSS-REFERENCE TO RELATED APPLICATIONS

This application is a Continuation of U.S. application Ser. No. 12/099,382 filed Apr. 8, 2008, the complete disclosure of which, in its entirety, is herein incorporated by reference.

BACKGROUND OF THE INVENTION

The embodiments of the invention generally relate to an integrated circuit structure and an associated design structure for the integrated circuit structure for built-in self testing, and, more particularly, to the integration of logic built-in self test into an existing array built-in self test repair flow.

DESCRIPTION OF THE RELATED ART

As technology features scale, circuits become more and more prone to defects, particularly of an AC nature. New chip designs in nanometer technologies integrate more logic and memory onto each die at the same time. The result is that yield of a chip with no defects is becoming especially difficult. Memories address this by incorporating redundancy. Array BIST (built in self test) can be used to efficiently test memories and determine if repairs are necessary. Some chips also include BISR (built in self repair) logic. This logic will determine exactly which repairs are necessary for a memory. This same BISR logic can also usually dictate how those repairs are recorded (often stored in fuses) such that after test completes, the repairs are completed, and the self repaired chip is ready for use. Logic BIST (LBIST) is becoming more popular. It is used to test non-memory content on a chip and determine if it is working or not (particularly at-speed in-system). Unfortunately, the LBIST results are usually only of a pass/fail nature and are not integrated into any BISR flow.

SUMMARY OF THE INVENTION

In view of the foregoing, the invention integrates LBIST into an existing array BIST self repair flow. This flow allows for chips that contain logic of a certain organization to repair themselves with little extra test circuitry overhead, greatly increasing yield.

One embodiment of the invention provides an integrated circuit structure and an associated design structure for the integrated circuit structure. The integrated circuit structure has a plurality of logic blocks, at least one of which is a redundant logic block. In addition, the structure includes a logic built-in self test device (LBIST) operatively connected to the logic blocks that determines the functionality of each of the logic blocks.

An array of memory elements is included within the structure and is operatively connected to the logic blocks. At least one of the memory elements comprises a redundant memory element. The structure also includes an array built-in self test device (ABIST) operatively connected to the array of memory elements that determines the functionality of each of the memory elements.

The structure includes a register operatively connected to the LBIST and the ABIST that stores the logic block functionality and the memory element functionality. One feature of embodiments herein is the use of a single controller operatively connected to the register, the logic blocks, and the memory elements. The single controller repairs logic block elements that have failing functionality.

The single controller uses the redundant logic block, to repair a failing logic block and repairs a failing memory element using a redundant memory element. More specifically, the single controller substitutes the redundant logic block for a logic block that has failing functionality and substitutes the redundant memory element for a memory element that has failing functionality.

The structure also includes a plurality of fuses connected to the single controller. The single controller selectively blows fuses according to the logic block functionality and the memory element functionality as determined by the LBIST and ABIST, in order to substitute the redundant logic block for the logic block that has failing functionality, and in order to substitute the redundant memory element for the memory element that has failing functionality.

The integrated circuit structure can be a single integrated circuit chip, and the logic blocks, the array of memory elements, the LBIST, the ABIST, and the register are all contained within the single integrated circuit chip. Each of the logic blocks comprises an independent processor that performs logical actions in response to inputs independently of other ones of the logic blocks. Each of the logic blocks has a storage element connected to the LBIST that stores the logic block functionality and another storage element that stores the unique identifier of the logic block. Each of the logic blocks uses a gate connected to the first storage element. The gate controls whether the logic block performs operations based on the logic block functionality stored in the first storage element.

With respect to method embodiments herein, such embodiments test, using the (LBIST) of the integrated circuit structure, logic blocks of the integrated circuit structure to determine the logic block functionality of each of the logic blocks. The method embodiments similarly test, using the ABIST of the integrated circuit structure, the array of memory elements of the integrated circuit structure to determine the memory element functionality of each of the memory elements.

The methods store, in the register of the integrated circuit structure, the logic block functionality and the memory element functionality. The methods use the single controller of the integrated circuit structure to repair the logic blocks elements that have failing functionality and the memory elements that have failing functionality.

The process of repairing the failing logic blocks and failing memory elements comprises substituting the redundant logic block of the integrated circuit structure for a logic block having failing functionality and substituting a redundant memory element of the integrated circuit structure for a memory element having failing functionality. More specifically, the repairing process comprises selectively blowing fuses of the integrated circuit structure according to the logic block functionality and the memory element functionality as determined by the LBIST and ABIST to substitute the redundant logic block for the logic block having failing functionality and substitute the redundant memory element for the memory element having failing functionality.

The method stores the logic block functionality using a storage element within each of the logic blocks. The method also controls whether the logic block performs operations based on the logic block functionality stored in the first storage element.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF THE INVENTION

Figure 1:
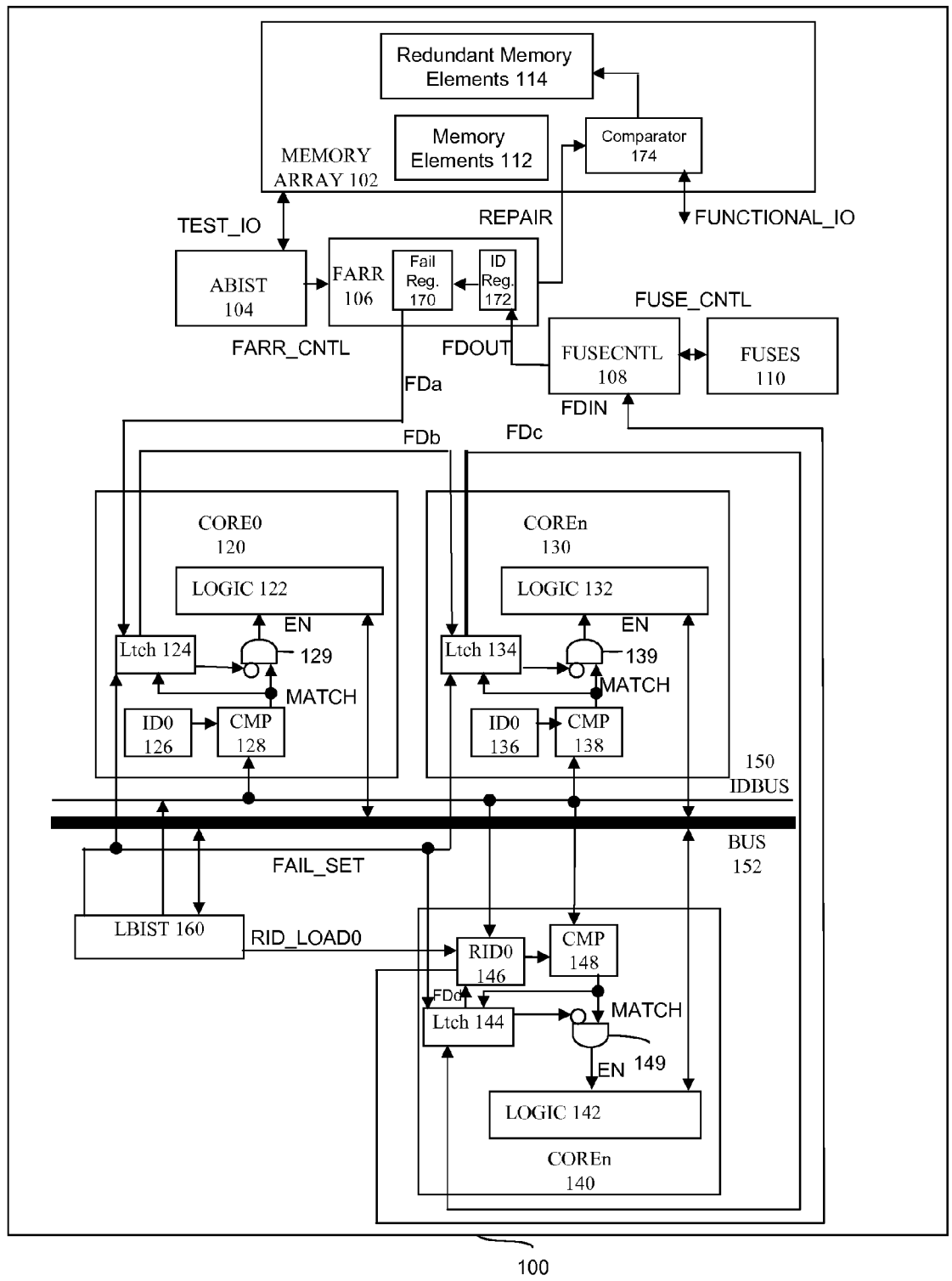
FIG. 1 illustrates a schematic diagram of a circuit structure according to embodiments herein.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Referring now to FIG. 1, one embodiment of the invention comprises an integrated circuit structure 100, such as an integrated circuit chip. The exemplary structure shown in FIG. 1, includes a plurality of logic blocks (cores) 120, 130, 140, at least one of which is a redundant logic block 140. In addition, the structure includes a logic built-in self test device (LBIST) 160 operatively connected to the logic blocks 120, 130, 140 that determines the functionality of each of the logic blocks 120, 130, 140.

An array 102 of memory elements 112 is included within the structure and is operatively connected to the logic blocks 120, 130, 140. At least one of the memory elements 112 comprises a redundant memory element 114. The structure also includes an array built-in self test device (ABIST) 104 operatively connected to the array of memory elements 102 that determines the functionality of each of the memory elements 112.

The structure includes a register 106 (such as a failing address and repair register (FARR)) operatively connected to the ABIST 104 that stores the memory element functionality. A first register 170 within the FARR 106 is operatively connected to the ABIST 104 and stores the memory element functionality as determined by the ABIST 104. A second register 172 within the FARR 106 is also operatively connected to the ABIST 104 and stores an identifier for failing memory elements. Further, the structure includes a first comparator 174 that is operatively connected to the second register 172 that enables the redundant memory element to operate in place of the failing memory elements.

One feature of embodiments herein is the use of a single controller 108 operatively connected to the register, the logic blocks 120, 130, 140, and the memory elements 112. For example, the single controller 108 can comprise a fuse controller. That single controller 108 repairs logic blocks 120, 130, 140 elements that have failing functionality using the redundant logic block 140, and repairs memory elements 112 that have failing functionality using the redundant memory element 114. More specifically, the single controller 108 substitutes the redundant logic block 140 for a logic block that has failing functionality and substitutes the redundant memory element 114 for a memory element that has failing functionality.

The structure also includes a plurality of fuses 110 connected to the single controller 108. The single controller 108 selectively blows fuses according to the logic block functionality and the memory element functionality as determined by the LBIST 160 and ABIST 104 to substitute the redundant logic block 140 for the logic block that has failing functionality and substitute the redundant memory element 114 for the memory element that has failing functionality. For a complete discussion regarding electrically blowing fuses, see U.S. Pat. No. 6,768,694 (incorporated herein by reference) which discloses a method of electrically blowing fuses under control of an on-chip tester interface apparatus and U.S. Pat. No. 7,251,756 (incorporated herein by reference) which discloses a method and apparatus for increasing fuse programming yield through preferred use of duplicate data.

The integrated circuit structure 100 can be a single integrated circuit chip, and the logic blocks 120, 130, 140, the array of memory elements 112, the LBIST 160, the ABIST 104, and the register 106 are all contained within the single integrated circuit chip. Each of the logic blocks 120, 130, 140 comprises an independent processor (logic 122, 132, 142) that performs logical actions in response to inputs independently of other ones of the logic blocks 120, 130, 140.

Many complex chip designs use such repeated core blocks that share such a common bus. Many multi-core microprocessors take this approach. Each core essentially responds to a unique identifier (much like each memory element responds to a unique address). The identifier (ID0-IDn) can be contained in each core (can be hard coded or programmable). Any bus access to the core can be prefixed with a core ID tag which can be compared (via comparator logic in each core) to the ID value and the core with the matching value would be enabled (via a MATCH signal). Each normal core 120, 130 (CORE0-COREn) simply needs to incorporate a single pass/fail latch. This latch can be set by LBIST testing (a core that failed LBIST testing would have its latch set to a '1' when the FAIL_SET signal is activated by the LBIST controller and the ID on the IDBUS matches the ID of that core). If the FAIL latch is '1' then a future MATCH activations for that core would be suppressed, disabling that core from accessing the system BUS.

Redundant cores 140 (RCORE0) operate similarly to a normal core 120, 130 except their identifier would be programmable (RID register). If the LBIST 160 determines a core is failing, it will locate a non-failing redundant core and program the identifier for that redundant core to match that of the failing core by placing the desired ID on the IDBUS 150 and activating RID_LOAD to cause a particular RCORE to store that ID that the RCORE is replacing in RID 146. Any subsequent core operations using that ID tag would be handled by the RCORE 140 rather than the failing normal CORE 120, 130. Each RCORE also contains a FAIL latch 144 in case that RCORE is ever found to be failing itself and needs to be deactivated. It should be noted that for multiple test passes where previously used RCOREs could be marked as failing, the LBIST controller reads access to each RCOREs FAIL latch to determine where future repairs need to be directed.

Therefore, each of the logic blocks 120, 130, 140 has a storage element 124, 134, 144 (such as a latch) connected to the LBIST 160 that stores the logic block functionality and another storage element 126, 136, 146 (such as a register) that stores the unique identifier (ID) of the logic block. Further, the latch 124 is sometimes referred to herein as a third register 124, and, again, this third register 124 is operatively connected to the LBIST 160 and stores the logic block functionality. Also, the register 146 is sometimes referred to herein as a fourth register 146 and is operatively connected to the LBIST 160 and stores an identifier for failing logic blocks.

Each of the logic blocks 120, 130, 140 uses a gate (129, 139, 149) connected to the first storage element (124, 134, 144). The gate (129, 139, 149) controls whether the logic block performs operations based on the logic block functionality stored in the first storage element (124, 134, 144).

More specifically, a comparator (128, 138, 148) receives an ID from the ID bus 150 and compares this with the ID stored within the register (126, 136, 146). If the ID from the ID bus 150 matches the logic block's ID an indication of an acceptable match is sent to the AND gate 129, 139, 149. The comparator 148 serves as a second comparator 148 (again operatively connected to the fourth register 146) that enables the redundant logic block 140 to operate in place of the failing logic blocks. The latch 124, 134, 144 stores the logic block's functionality. If the latch 124, 134, 144 indicates that the logic block has good functionality and the comparator 128, 138, 148 indicates that the address is appropriate for the specific logic block, the AND gate 129, 139, 149 allows the logic unit 122, 132, 142 to execute any appropriate operation through the bus 152.

Figure 2:
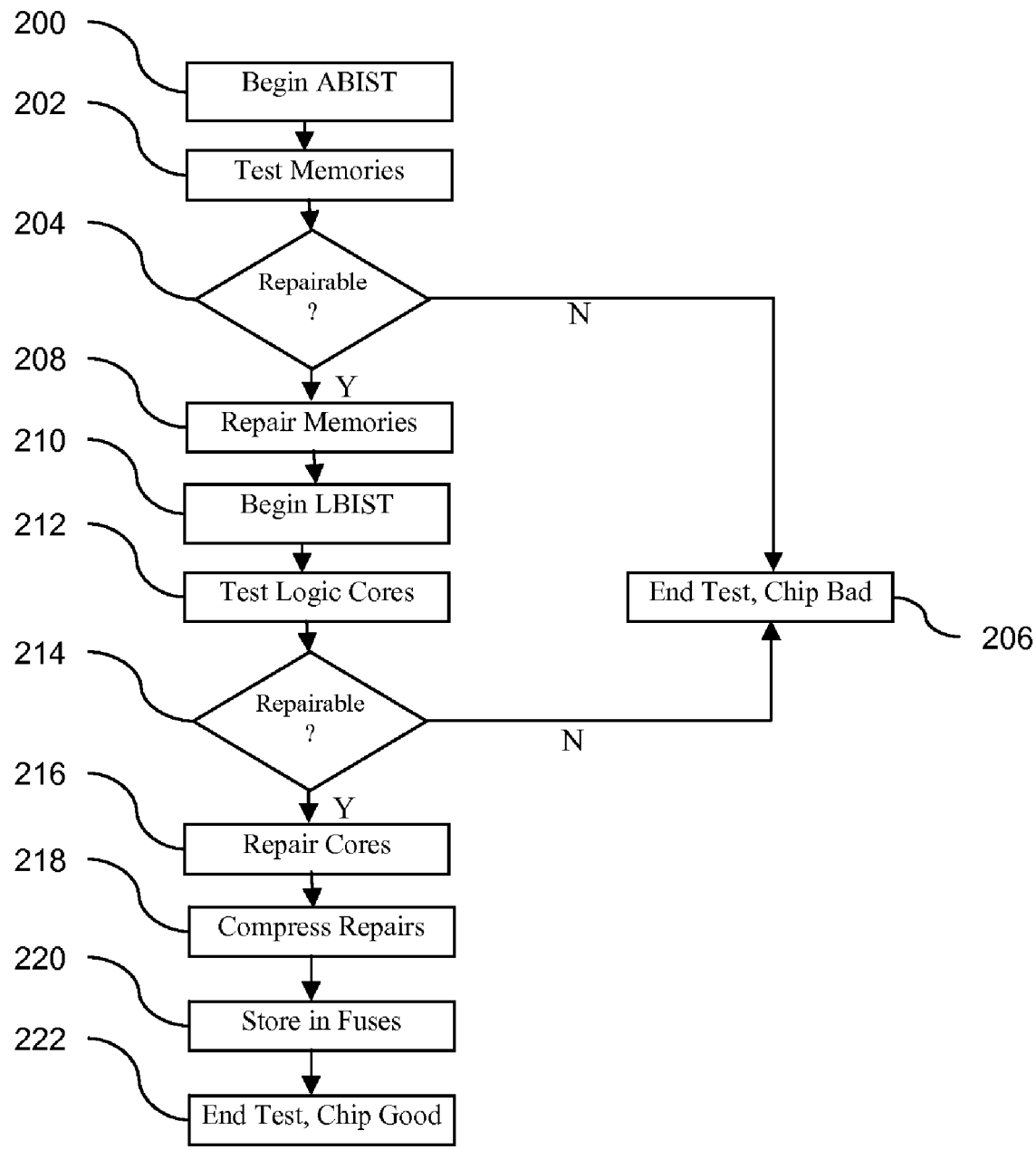
FIG. 2 is a flow diagram illustrating a preferred method of an embodiment of the invention.

FIG. 2 is a flowchart illustrating one exemplary method embodiment herein. More specifically, in item 100, the method begins by using the ABIST of the integrated circuit structure. For a complete discussion of ABIST, see U.S. Pat. No. 7,257,745 (incorporated herein by reference) which discloses array self repair using built-in self test techniques. In item 202, the array of memory elements of the integrated circuit structure are tested by the ABIST to determine the memory element functionality of each of the memory elements. Item 204 determines whether the memories are repairable (as described above). If the memories are not repairable, the test is ended and the chip is identified as being defective (bad) in item 206. Otherwise, the memories are repaired (as discussed above) in item 208.

Next, in item 210, the method begins the LBIST process. In item 212, the method embodiments similarly test, using the LBIST of the integrated circuit structure, logic blocks of the integrated circuit structure to determine the logic block functionality of each of the logic blocks. Item 214 determines whether the logic blocks are repairable (as described above). If the logic blocks are not repairable, the test is ended and the chip is identified as being defective (bad) in item 206. Otherwise, the logic blocks are repaired (as discussed above) in item 216. In item 218, the repairs are compressed. For a complete discussion of fuse compression/decompression, see U.S. Pat. No. 6,856,569 (incorporated herein by reference).

As mentioned above, the methods store, in the register 106 of the integrated circuit structure, the logic block functionality and the memory element functionality. The methods use the single controller 108 of the integrated circuit structure to repair the logic blocks elements (216) that have failing functionality and the memory elements (208) that have failing functionality. Further, the method stores the logic block functionality using a first storage 124, 134, 144 of each of the logic blocks 120, 130, 140. The method also controls whether the logic block performs operations based on the logic block functionality stored in the first storage element 124, 134, 144.

The process of repairing the failing logic blocks (216) and failing memory elements (208) comprises substituting the redundant logic block of the integrated circuit structure for a logic block having failing functionality and substituting a redundant memory element of the integrated circuit structure for a memory element having failing functionality.

As shown in item 220, the repairing process is completed by selectively blowing fuses of the integrated circuit structure according to the logic block functionality and the memory element functionality as determined by the LBIST and ABIST to substitute the redundant logic block for the logic block having failing functionality and substitute the redundant memory element for the memory element having failing functionality. For an overall chip pass/fail, the LBIST controller reads access to all RCORE and CORE FAIL latches to determine if enough working cores are present to constitute a passing/working chip. The end result is a good chip at the end of the test (222).

Thus, with embodiments herein each FAIL latch 124, 134, 144 and RID register 146 are part of the repair ring used by memories. Each memory 112 under test includes a BIST for stimulating the memory, and a failing address and repair registers (FARR) 106 for recording any failing addresses and allocating redundancy to replace them. Each FARR 106 is also part of the repair ring. All latches on the repair ring (both logic and memory information) would be rotated (shifted in a serial fashion) by the single controller 108 (FUSECNTL logic) such that the data contained in the latches is compressed into a fuse solution and blown into fuses 110.

Further, multiple pass fuse solutions are used in certain embodiments herein so that fails can be gathered over many test passes. The serial connections exit the controller 108 as an FDOUT serial data output, pass through serial connections between each FARR 106, FAIL latch 126, 136, 146, and RID 146 (using FDa through FDd) and return to the controller 108 as FDIN. Upon subsequent power up operations, the controller 108 senses the fuses 110, decompresses the repair information and rotates the data into the repair ring, enabling repairs to both logic and memory blocks. Therefore, embodiments herein use a single controller 108 to enable repairs to both logic and memory blocks.

A method could use an off-chip tester to process the LBIST results off chip and determine a corrective action. This action could then be stored in a non-volatile memory programmed directly by the tester. However, the present embodiments do this all on the chip. This is useful because it enables low end chip designs to easily take advantage of logic repair, increasing yield. The present embodiments simplify the BIST process enough so that logic repairs are made as easily as array repairs. Thus, embodiments herein make logic repairs as simple as array repairs by integrating them into the same self repair system.

Figure 3:
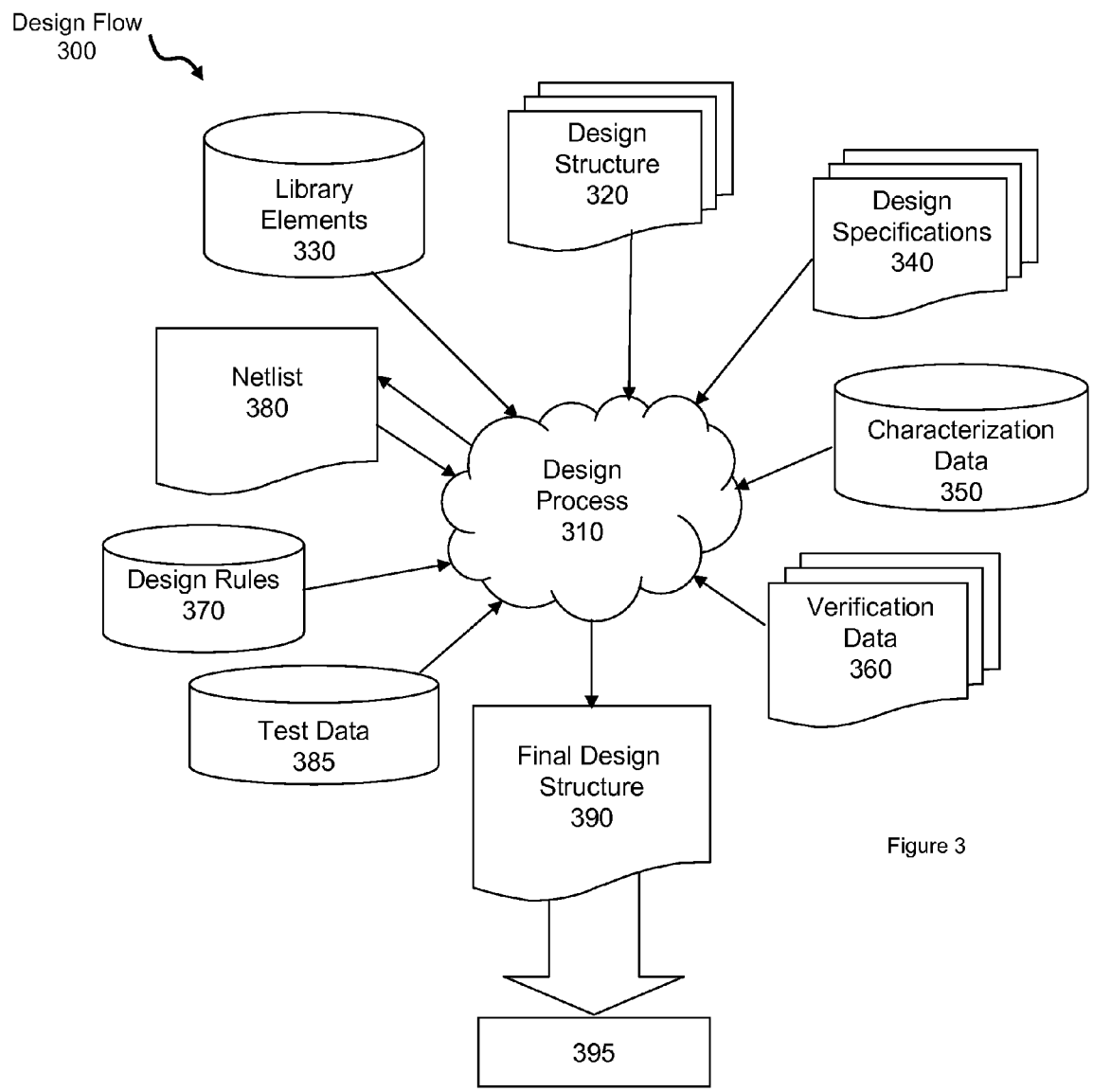
FIG. 3 is a flow diagram of a design process used in semiconductor design, manufacture, and/or test.

FIG. 3 shows a block diagram of an exemplary design flow 300 used for example, in semiconductor design, manufacturing, and/or test. Design flow 300 may vary depending on the type of IC being designed. For example, a design flow 300 for building an application specific IC (ASIC) may differ from a design flow 300 for designing a standard component or from a design from 300 for instantiating the design into a programmable array, for example a programmable gate array (PGA) or a field programmable gate array (FPGA) offered by Altera® Inc. or Xilinx® Inc. Design structure 320 is preferably an input to a design process 310 and may come from an IP provider, a core developer, or other design company or may be generated by the operator of the design flow, or from other sources. Design structure 320 comprises an embodiment of the invention as shown in FIG. 1 in the form of schematics or HDL, a hardware-description language (e.g., Verilog, VHDL, C, etc.). Design structure 320 may be contained on one or more machine readable medium. For example, design structure 320 may be a text file or a graphical representation of an embodiment of the invention as shown in FIG. 1. Design process 310 preferably synthesizes (or translates) an embodiment of the invention as shown in FIG. 1 into a netlist 380, where netlist 380 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, or other tangible memory. The synthesis may be an iterative process in which netlist 380 is resynthesized one or more times depending on design specifications and parameters for the circuit.

Design process 310 may include using a variety of inputs; for example, inputs from library elements 330 which may house a set of commonly used elements, circuits, and devices, including models, layouts, and symbolic representations, for a given manufacturing technology (e.g., different technology nodes, 32 nm, 45 nm, 90 nm, etc.), design specifications 340, characterization data 350, verification data 360, design rules 370, and test data files 385 (which may include test patterns and other testing information). Design process 310 may further include, for example, standard circuit design processes such as timing analysis, verification, design rule checking, place and route operations, etc. One of ordinary skill in the art of integrated circuit design can appreciate the extent of possible electronic design automation tools and applications used in design process 310 without deviating from the scope and spirit of the invention. The design structure of the invention is not limited to any specific design flow.

Design process 310 preferably translates an embodiment of the invention as shown in FIG. 1, along with any additional integrated circuit design or data (if applicable), into a second design structure 390. Design structure 390 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 390 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 390 may then proceed to a stage 395 where, for example, design structure 390: proceeds to tape-out, is released to manufacturing, is released to a mask house, is sent to another design house, is sent back to the customer, etc.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments.

It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. An integrated circuit structure comprising:
    a plurality of logic blocks, wherein at least one of said logic blocks comprises a redundant logic block;
    a logic built-in self test device (LBIST) operatively connected to said logic blocks that determines a logic block functionality of each of said logic blocks;
    an array of memory elements operatively connected to said logic blocks, wherein at least one of said memory elements comprises a redundant memory element;
    an array built-in self test device (ABIST) operatively connected to said array of memory elements that determines a memory element functionality of each of said memory elements;
    a first register operatively connected to said ABIST that stores said memory element functionality;
    a second register operatively connected to said ABIST that stores an identifier for failing memory elements;
    a first comparator operatively connected to said second register that enables said redundant memory element to operate in place of said failing memory elements;
    a third register operatively connected to said LBIST that stores said logic block functionality;
    a fourth register operatively connected to said LBIST that stores an identifier for failing logic blocks;
    a second comparator operatively connected to said fourth register that enables said redundant logic block to operate in place of said failing logic blocks; and
    a single controller operatively connected to said first register, said second register, said third register, said fourth register, said logic blocks, and said memory elements, that repairs said failing logic blocks using said redundant logic block, and that repairs said failing memory elements using said redundant memory element.

2. The integrated circuit structure according to claim 1, wherein said single controller substitutes said redundant logic block for said failing logic blocks and substitutes said redundant memory element for said failing memory elements.

3. The integrated circuit structure according to claim 2, further comprising a plurality of fuses connected to said controller, wherein said controller selectively blows ones of said fuses according to said logic block functionality and said memory element functionality as determined by said LBIST and ABIST to substitute said redundant logic block for said failing logic blocks and to substitute said redundant memory element for said failing memory elements.

4. The integrated circuit structure according to claim 1, wherein each of said logic blocks comprises said third register.

5. The integrated circuit structure according to claim 4, wherein each of said logic blocks comprises a gate connected to said third register, wherein said gate controls whether said logic block performs operations based on said logic block functionality stored in said third register.

6. The integrated circuit structure according to claim 1, wherein said integrated circuit structure comprises a single integrated circuit chip, and wherein said logic blocks, said away of memory elements, said LBIST, said ABIST, said first register, said second register, said third register, said fourth register, said first comparator, and said second comparator are all contained within said single integrated circuit chip.

7. The integrated circuit structure according to claim 1, wherein each of said logic blocks comprises an independent processor that performs logical actions in response to inputs independently of other ones of said logic blocks.

8. A design structure embodied in a machine readable medium, the design structure comprising integrated circuit structure comprising:
   a plurality of logic blocks, wherein at least one of said logic blocks comprises a redundant logic block;
   a logic built-in self test device (LBIST) operatively connected to said logic blocks that determines a logic block functionality of each of said logic blocks;
   an array of memory elements operatively connected to said logic blocks, wherein at least one of said memory elements comprises a redundant memory element;
   an array built-in self test device (ABIST) operatively connected to said array of memory elements that determines a memory element functionality of each of said memory elements;
   a first register operatively connected to said ABIST that stores said memory element functionality;
   a second register operatively connected to said ABIST that stores an identifier for failing memory elements;
   a first comparator operatively connected to said second register that enables said redundant memory element to operate in place of said failing memory elements;
   a third register operatively connected to said LBIST that stores said logic block functionality;
   a fourth register operatively connected to said LBIST that stores an identifier for failing logic blocks;
   a second comparator operatively connected to said fourth register that enables said redundant logic block to operate in place of said failing logic blocks; and
   a single controller operatively connected to said first register, said second register, said third register, said fourth register, said logic blocks, and said memory elements, that repairs said failing logic blocks using said redundant logic block, and that repairs said failing memory elements using said redundant memory element.

9. The design structure according to claim 8, wherein said single controller substitutes said redundant logic block for said failing logic blocks and substitutes said redundant memory element for said failing memory elements.

10. The design structure according to claim 9, further comprising a plurality of fuses connected to said controller, wherein said controller selectively blows ones of said fuses according to said logic block functionality and said memory element functionality as determined by said LBJST and ABIST to substitute said redundant logic block for said failing logic blocks and to substitute said redundant memory element for said failing memory elements.

11. The design structure according to claim 8, wherein each of said logic blocks comprises said third register.

12. The design structure according to claim 11, wherein each of said logic blocks comprises a gate connected to said third register, wherein said gate controls whether said logic block performs operations based on said logic block functionality stored in said third register.

13. The design structure according to claim 8, wherein said integrated circuit structure comprises a single integrated circuit chip, and wherein said logic blocks, said array of memory elements, said LBJST, said ABIST, said first register, said second register, said third register, said fourth register, said first comparator, and said second comparator are all contained within said single integrated circuit chip.

14. An integrated circuit structure comprising:
   a plurality of logic blocks, wherein at least one of said logic blocks comprises a redundant logic block;
   a logic built-in self test device (LBIST) operatively connected to said logic blocks that determines a logic block functionality of each of said logic blocks;
   an array of memory elements operatively connected to said logic blocks, wherein at least one of said memory elements comprises a redundant memory element;
   an array built-in self test device (ABIST) operatively connected to said array of memory elements that determines a memory element functionality of each of said memory elements;
   a first register operatively connected to said ABIST that stores said memory element functionality;
   a second register operatively connected to said ABIST that stores an identifier for failing memory elements;
   a first comparator operatively connected to said second register that enables said redundant memory element to operate in place of said failing memory elements;
   a third register operatively connected to said LBIST that stores said logic block functionality;
   a fourth register operatively connected to said LBIST that stores an identifier for failing logic blocks;
   a second comparator operatively connected to said fourth register that enables said redundant logic block to operate in place of said failing logic blocks; and
   a single controller operatively connected to said first register, said second register, said third register, said fourth register, said logic blocks, and said memory elements, that repairs said failing logic blocks using said redundant logic block, and that repairs said failing memory elements using said redundant memory element,
   wherein said single controller substitutes said redundant logic block for said failing logic blocks and substitutes said redundant memory element for said failing memory elements.

15. The integrated circuit structure according to claim 14, further comprising a plurality of fuses connected to said controller, wherein said controller selectively blows ones of said fuses according to said logic block functionality and said memory element functionality as determined by said LBIST and ABIST to substitute said redundant logic block for said failing logic blocks and to substitute said redundant memory element for said failing memory elements.

16. The integrated circuit structure according to claim 14, wherein each of said logic blocks comprises said third register.

17. The integrated circuit structure according to claim 14, wherein each of said logic blocks comprises a gate connected to said third register, wherein said gate controls whether said logic block performs operations based on said logic block functionality stored in said third register.

18. The integrated circuit structure according to claim 14, wherein said integrated circuit structure comprises a single integrated circuit chip, and wherein said logic blocks, said away of memory elements, said LBIST, said ABIST, said first register, said second register, said third register, said fourth register, said first comparator, and said second comparator are all contained within said single integrated circuit chip.

19. The integrated circuit structure according to claim 14, wherein each of said logic blocks comprises an independent processor that performs logical actions in response to inputs independently of other ones of said logic blocks.

* * * * *